US012435420B2

(12) United States Patent
Preti et al.

(10) Patent No.: US 12,435,420 B2
(45) Date of Patent: Oct. 7, 2025

(54) REACTION CHAMBER FOR AN EPITAXIAL REACTOR OF SEMICONDUCTOR MATERIAL WITH NON-UNIFORM LONGITUDINAL SECTION AND REACTOR

(71) Applicant: LPE S.P.A., Baranzate (IT)

(72) Inventors: Silvio Preti, Baranzate (IT); Francesco Corea, Baranzate (IT); Maurilio Meschia, Baranzate (IT)

(73) Assignee: LPE S.P.A., Baranzate (IT)

( * ) Notice: Subject to any disclaimer, the term of this patent is extended or adjusted under 35 U.S.C. 154(b) by 452 days.

(21) Appl. No.: 17/414,763

(22) PCT Filed: Oct. 17, 2019

(86) PCT No.: PCT/IB2019/058873
§ 371 (c)(1),
(2) Date: Jun. 16, 2021

(87) PCT Pub. No.: WO2020/128653
PCT Pub. Date: Jun. 25, 2020

(65) Prior Publication Data
US 2022/0074048 A1 Mar. 10, 2022

(30) Foreign Application Priority Data
Dec. 17, 2018 (IT) ........................ 102018000011158

(51) Int. Cl.
*C23C 16/458* (2006.01)
*C23C 16/46* (2006.01)

(52) U.S. Cl.
CPC .......... *C23C 16/4586* (2013.01); *C23C 16/46* (2013.01)

(58) Field of Classification Search
None
See application file for complete search history.

(56) References Cited

U.S. PATENT DOCUMENTS 8,430,965 B2 * 4/2013 Kordina ............ H01L 21/67109 118/724
2004/0250773 A1 * 12/2004 Hasegawa ............... C23C 16/46 118/724
(Continued)

FOREIGN PATENT DOCUMENTS

CN 107723790 A 2/2018
WO 2004053188 A1 6/2004
(Continued)

*Primary Examiner* — Parviz Hassanzadeh
*Assistant Examiner* — Tiffany Z Nuckols
(74) *Attorney, Agent, or Firm* — Dickinson Wright PLLC; Andrew D. Dorisio; Nicholas P. Coleman

(57) ABSTRACT

The reaction chamber (100A) is used for a reactor for the deposition of semiconductor material on a substrate (62); it extends in a longitudinal direction and comprises a reaction and deposition zone (10) which extends in the longitudinal direction; this zone (10) is defined by susceptor elements (21A, 21B, 21C, 22A, 22B, 31, 32) adapted to be heated by electromagnetic induction; a first susceptor element (21A, 21B, 21C, 22A, 22B) is opposite to a substrate support element (61) of the chamber and has a hole (20) which extends in the longitudinal direction along its whole length; the first susceptor element (21A, 21B, 21C, 22A, 22B) has a non-uniform cross section that depends on its longitudinal position.

11 Claims, 15 Drawing Sheets

(56) References Cited

U.S. PATENT DOCUMENTS

| | | | | |
|---|---|---|---|---|
| 2006/0081187 A1* | 4/2006 | Maccalli | ................. | C23C 16/46 118/725 |
| 2016/0312382 A1* | 10/2016 | Corea | ..................... | C30B 25/08 |

FOREIGN PATENT DOCUMENTS

| | | |
|---|---|---|
| WO | WO2004053187 A1 | 6/2004 |
| WO | WO2007088420 A2 | 8/2007 |
| WO | WO2015092525 A1 | 6/2015 |

* cited by examiner

REACTION CHAMBER FOR AN EPITAXIAL REACTOR OF SEMICONDUCTOR MATERIAL WITH NON-UNIFORM LONGITUDINAL SECTION AND REACTOR

FIELD OF THE INVENTION

The present invention relates to a reaction chamber for an epitaxial reactor adapted to deposit semiconductor material on a substrate with a non-uniform longitudinal cross-section and a reactor that uses it.

In particular, the present invention relates to a "hot-wall" reaction chamber.

BACKGROUND

Such type of reaction chamber is used in particular for the epitaxial deposition of silicone carbide on a silicone carbide substrate ("homoepitaxial" process) or on a substrate made of another material ("heteroepitaxial" process).

In the past the Applicant has already worked with reaction chambers of this kind and has filed, for example, the two international patent applications WO2004053187A1 and WO2004053188A1 (which are incorporated herein for reference purposes).

Figure 1:
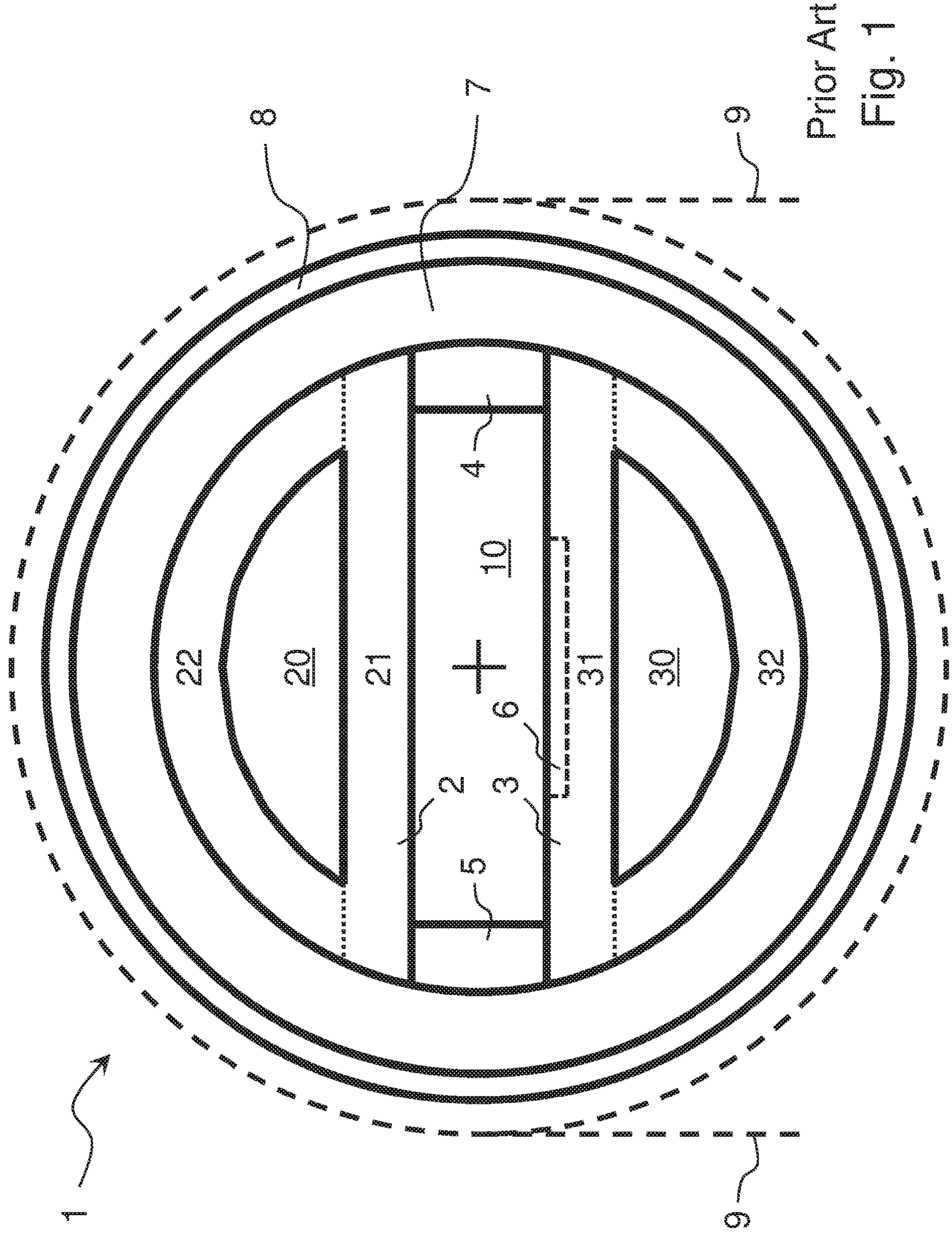
Prior Art Fig. 1
Figure 2:
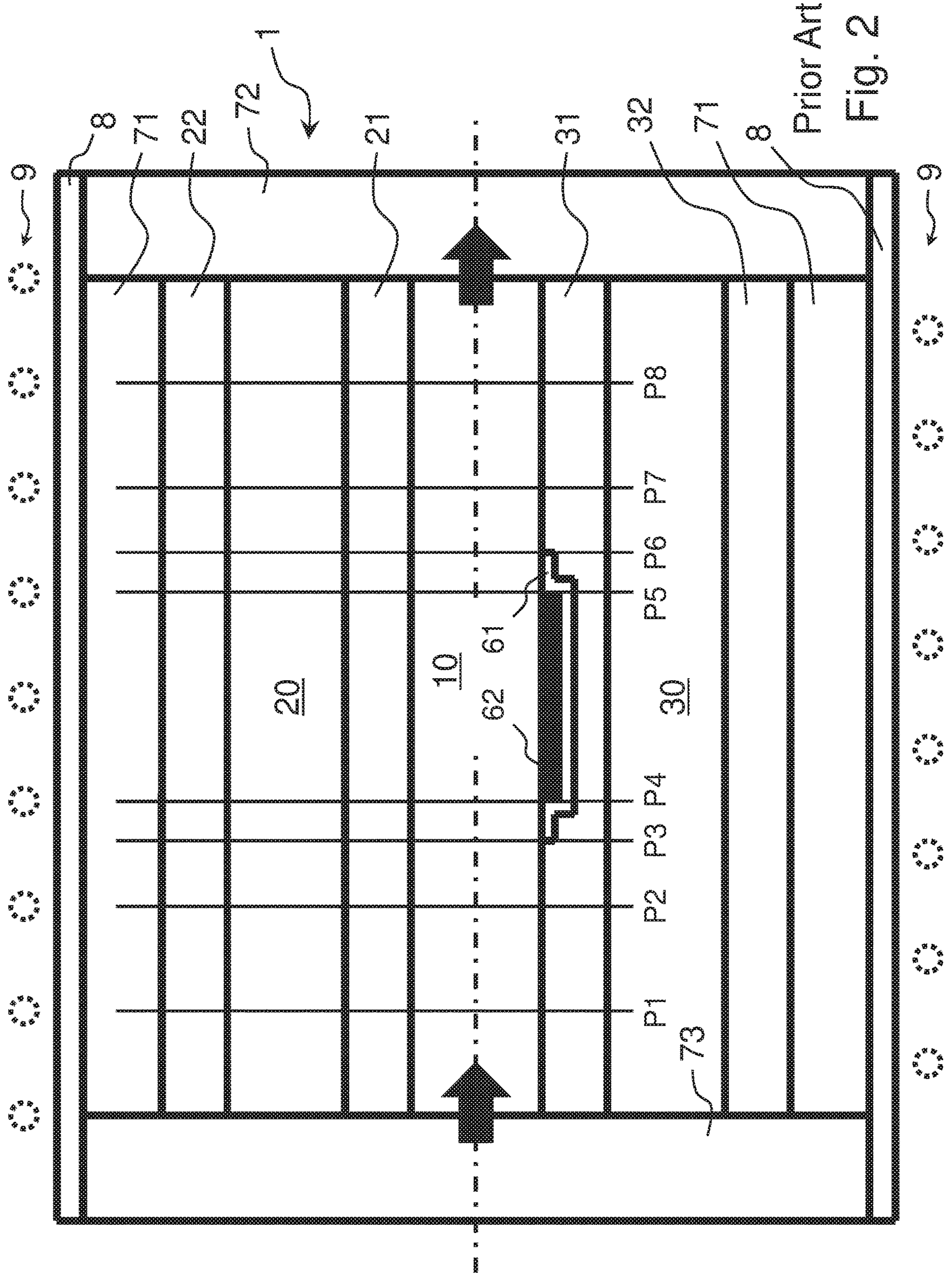
Prior Art Fig. 2
Figure 3:
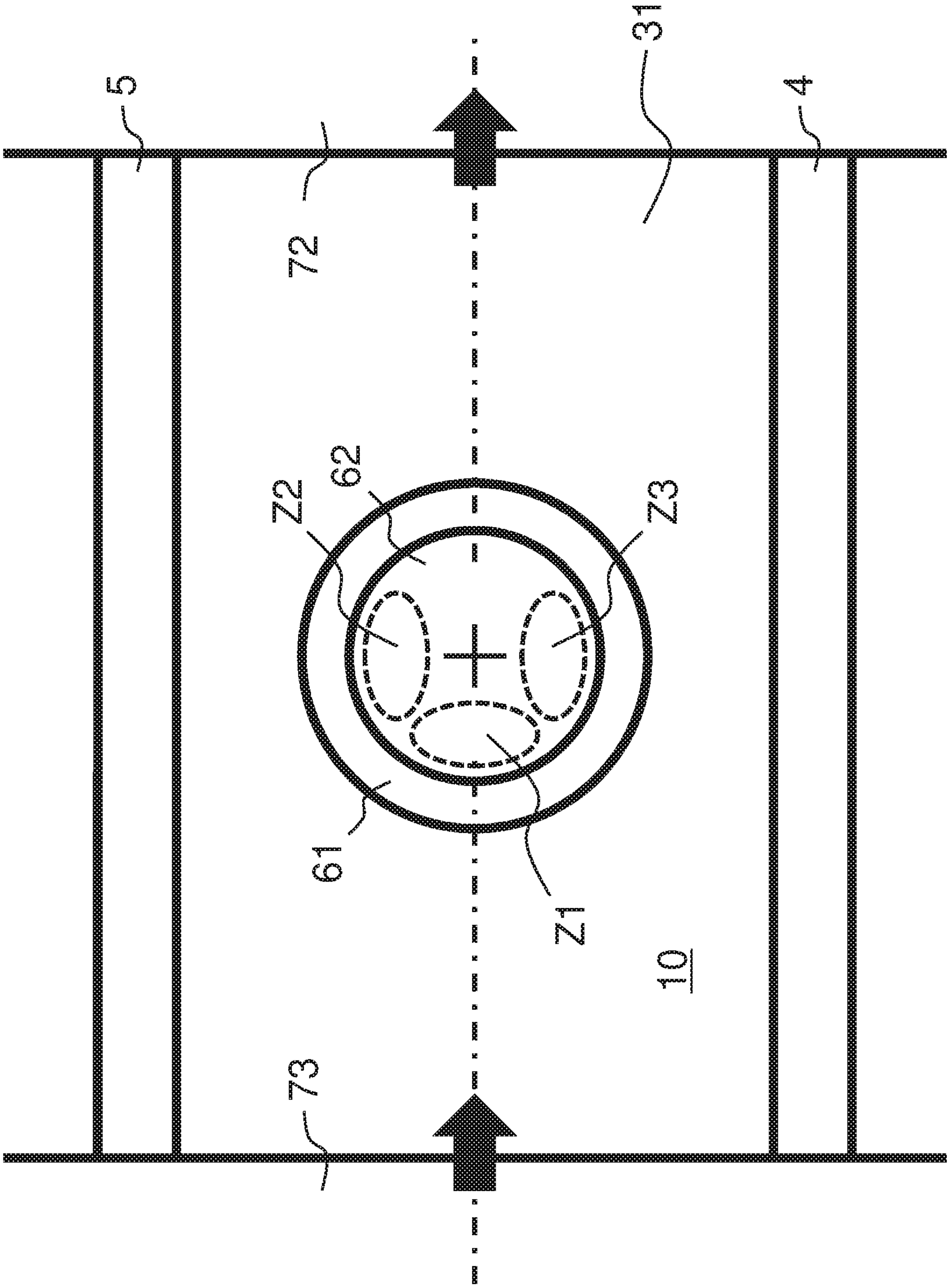
Prior Art Fig. 3

An example of a reaction chamber 1 of this type is illustrated schematically in FIG. 1 and FIG. 2 and FIG. 3; it extends uniformly along a longitudinal direction. It comprises a susceptor assembly comprised of four susceptor elements 2, 3, 4 and 5 that define a reaction and deposition zone 10 and that are contained in a casing 7 made of heat insulating material; the casing 7 is inserted in a quartz tube 8. The casing 7 is comprised of a tube 71 and two circular caps 72 and 73. Around the tube 8, an inductor 9 is wrapped, being adapted to heat by electromagnetic induction the elements 2, 3, 4 and 5 which are made of graphite; the inductor 9 is represented with a broken line because it is not strictly part of the reaction chamber 1. The inductor elements 4 and 5 are two strips and constitute the side walls of the zone 10. The elements 2 and 3 are two projection solids with a circular segment shaped section and with a through hole 20 and 30 having a circular segment shaped section; therefore, they are comprised of a flat plate 21 and 31 and a curved plate 22 and 32; the flat plates 21 and 31 constitute respectively the upper and lower walls of the zone 10. The lower wall 31 is adapted to house an assembly 6 that comprises, among other things, a support element 61 (typically rotatable during the deposition processes) adapted to support at least one substrate 62 subject to deposition; according to this example, the support element 61 can be inserted and extracted from the zone 10. The two caps 72 and 73 are shown as though they were closed; however, they represent openings, in particular an opening in the cap 73 for the inlet of precursor gases (see the black arrow) and an opening in the cap 72 for the outlet of exhaust gases (see the black arrow). The cross sections of the chamber 1 at positions P1, P2, P3, P4, P5, P6, P7 and P8 are identical (to be precise, almost identical).

The reaction chambers described and illustrated in these two patent applications had the aim, among other things, of maintaining a uniform temperature within the reaction and deposition zone (10 in FIG. 1 and FIG. 2 and FIG. 3) and, in particular, within the substrates subject to deposition (62 in FIG. 1 and FIG. 2 and FIG. 3).

Below, the Applicant has developed a solution, derived from that of these two patent applications, to obtain a vertical temperature difference within the reaction and deposition zone, and filed international patent application WO2007088420A2 (which is incorporated herein for reference purposes). Also this reaction chamber extends uniformly along a longitudinal direction.

In the chamber of FIG. 1 and FIG. 2 and FIG. 3 (and also in the chambers of the patent applications mentioned above), if a susceptor assembly is considered to be cut into thin axial sections equal to one another (i.e. of the same thickness), each section equally contributes to heating the reaction and deposition zone.

SUMMARY

Thanks to experiments recently performed, the Applicant realised that in order to obtain a desired temperature profile of the substrates subject to deposition during the deposition processes (e.g. a uniform temperature of the upper surfaces of the substrates during the deposition processes), such an equal contribution is not the best solution.

In the chamber of FIG. 1 and FIG. 2 and FIG. 3 (and also in the chambers of the patent applications mentioned above), it is almost impossible to directly measure for example the temperature in various points of the upper surface of the substrates during the deposition processes.

Therefore, the Applicant decided to perform indirect measurements with a particular methodology. According to this methodology, a substrate for example made of silicon carbide, is placed on the chamber support element, the reaction and deposition zone of the chamber is heated to the process temperature, hydrogen (instead of the usual mixtures of process gas) is allowed to flow into the reaction and deposition zone for a predetermined time, the reaction and deposition zone is cooled, the substrate thus treated is extracted from the reaction and deposition zone, and finally the thickness of the substrate thus treated is measured in various points; the temperature of the upper surface of the substrate (during treatment) in these various points can be detected from the respective thickness measurements there being a relationship between the "etching" speed of the hydrogen and the temperature.

The result of such indirect measurements is represented in FIG. 3. If the support element 61 does not rotate (and therefore the substrate 62 does not rotate either), the upper surface of the substrate 62 has a front zone Z1 that is colder as it is hit by the entering gases (see black arrow on the left of FIG. 3) in the reaction and deposition zone 10 which are relatively cold, and two side zones Z2 and Z3 which are hotter as they are close to the side walls 4 and 5 which are relatively hot. As, typically, the support element 61 rotates during the deposition process, such temperature non-uniformity of the substrate 62 is reduced, but not completely cancelled out.

The object of the present invention is to simply and effectively vary the contribution of the susceptor assembly to the heating of the reaction and deposition zone of the reaction chamber as a function of the longitudinal position.

In particular, it has been found that such contribution must be lower in the central part of the reaction and deposition zone (e.g. with reference to FIG. 2, between the longitudinal positions P2 and P7 or P3 and P6 or P4 and P5), i.e. where the substrates (62 in FIG. 2) subject to deposition are located.

A further object of the present invention is to simply and effectively vary the contribution of the susceptor assembly to the heating of the reaction and deposition zone of the reaction chamber as a function of the transversal position.

This general object and other objects are reached thanks to what is expressed in the appended claims that form an integral part of the present description.

The subject matter of the present invention is also a reactor that uses such reaction chamber.

LIST OF FIGURES

Figure 4A:
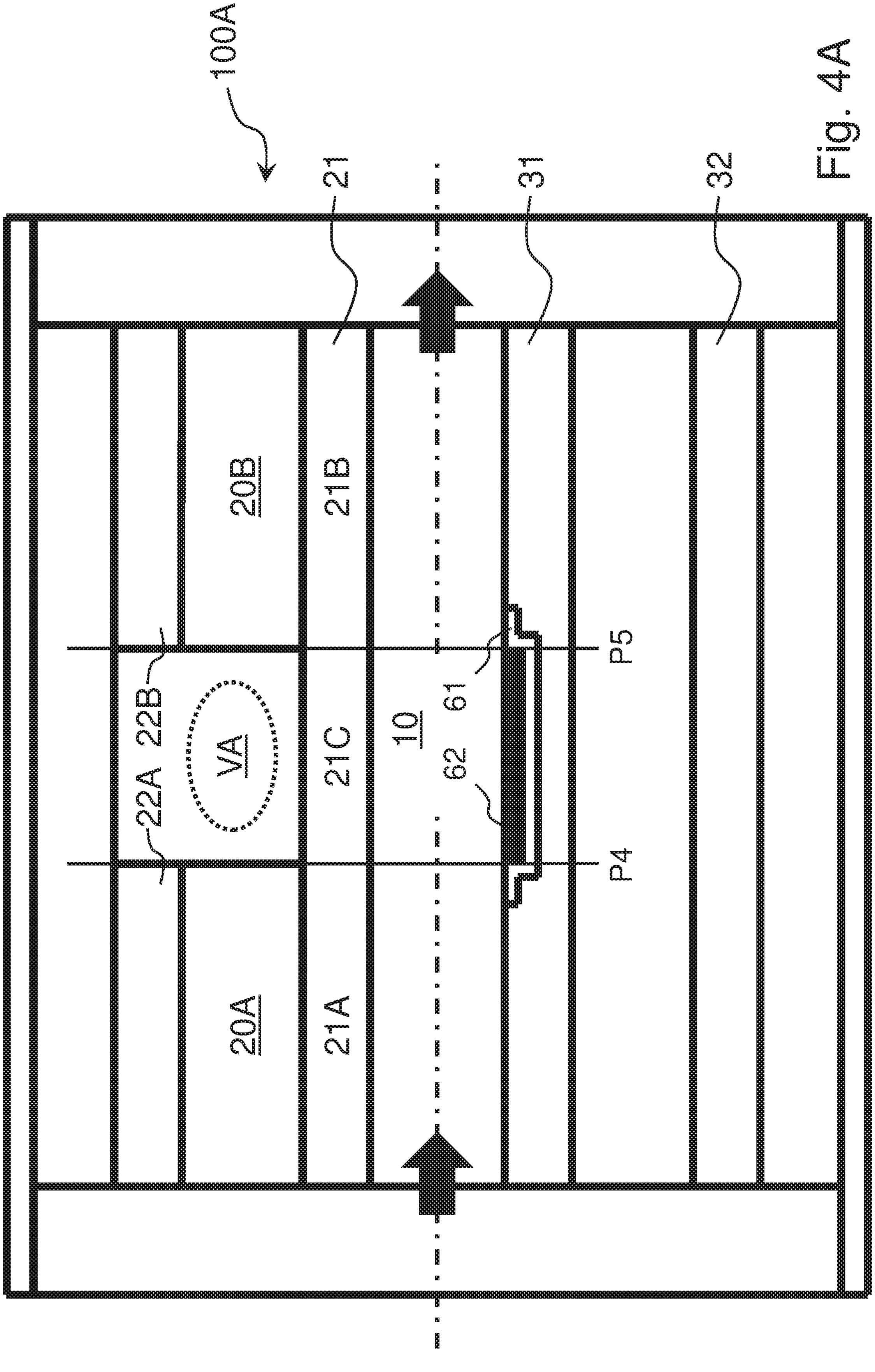
Figure 4B:
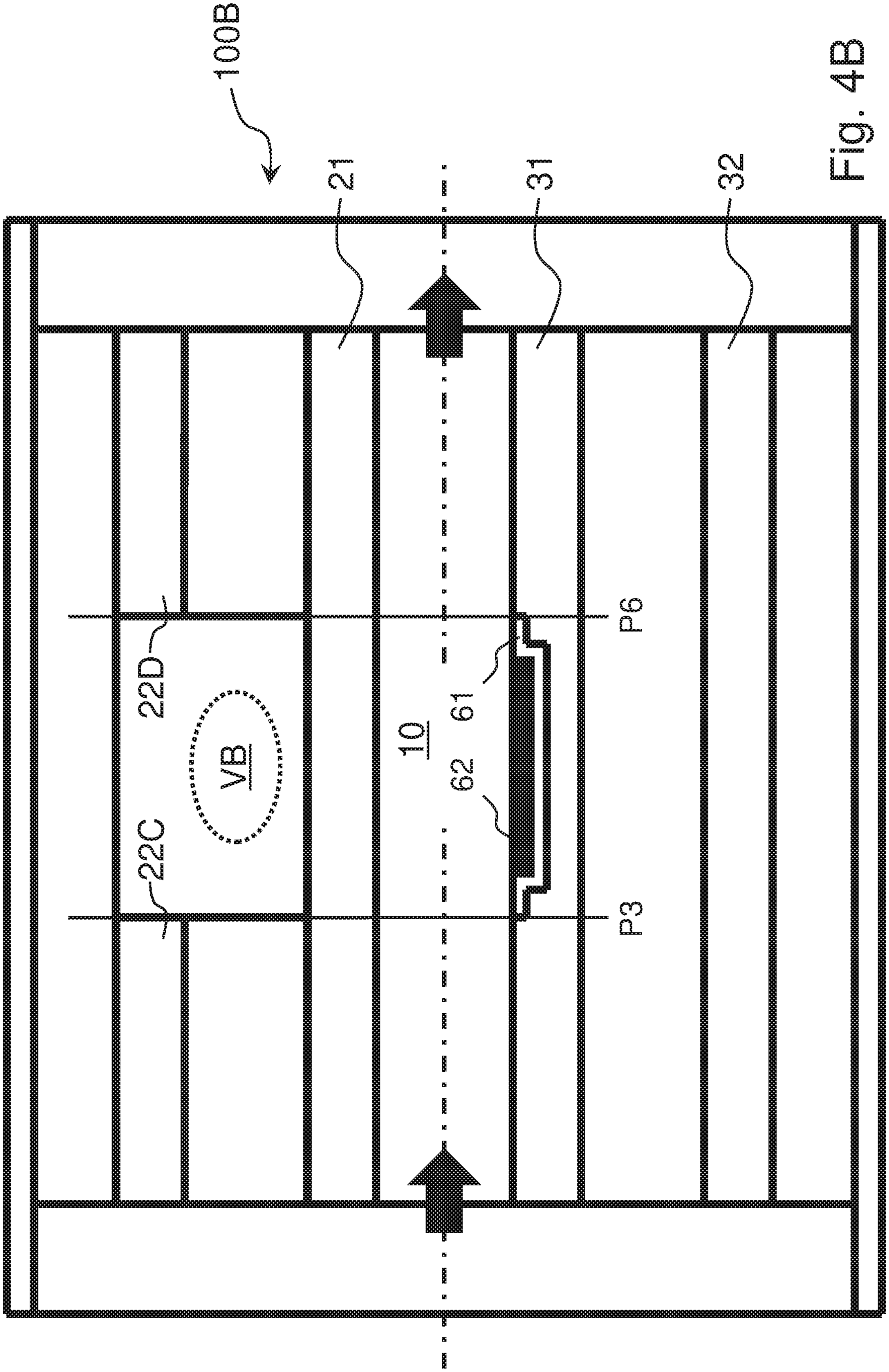
Figure 4C:
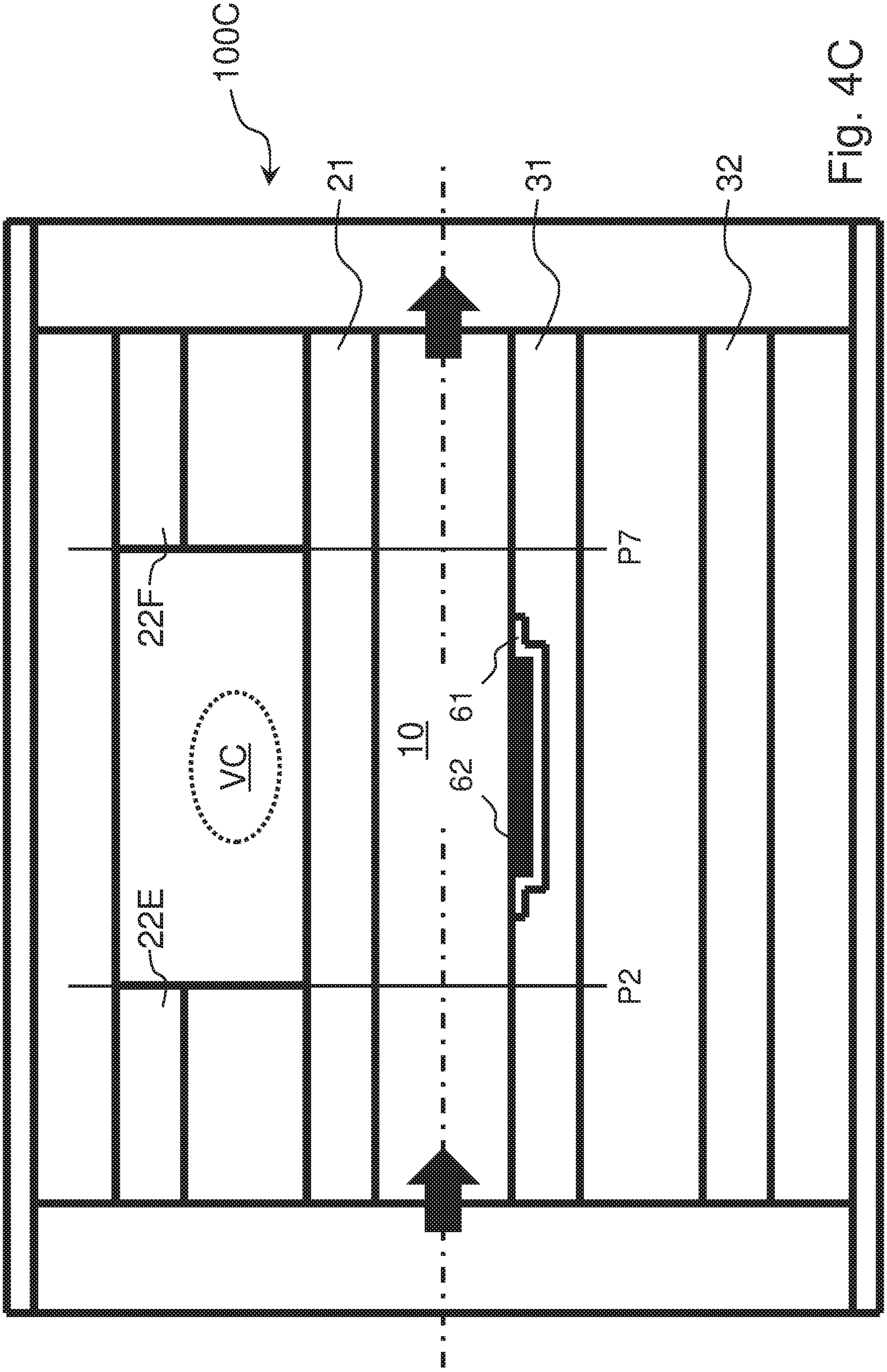
Figure 4D:
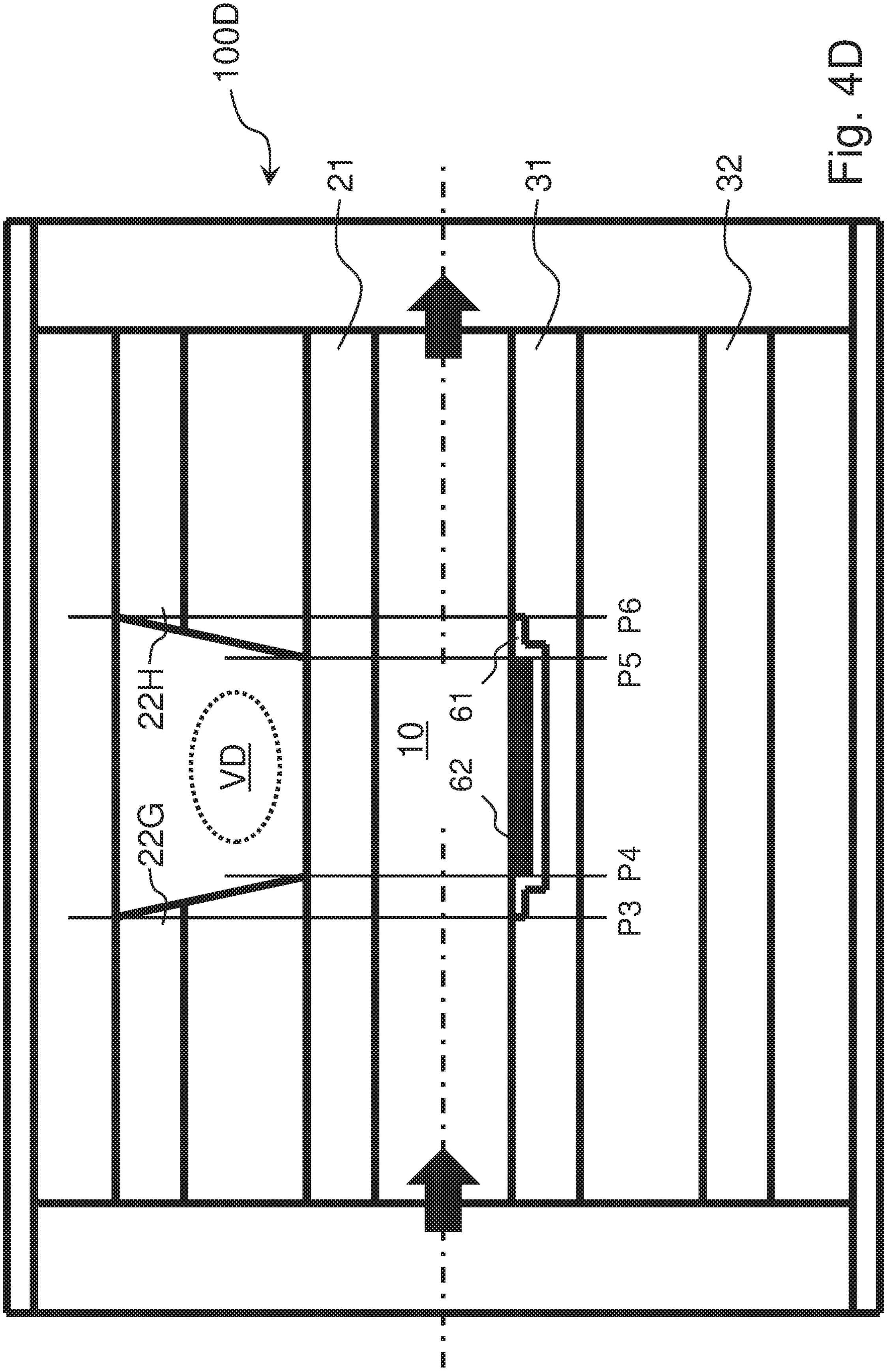
Figure 4E:
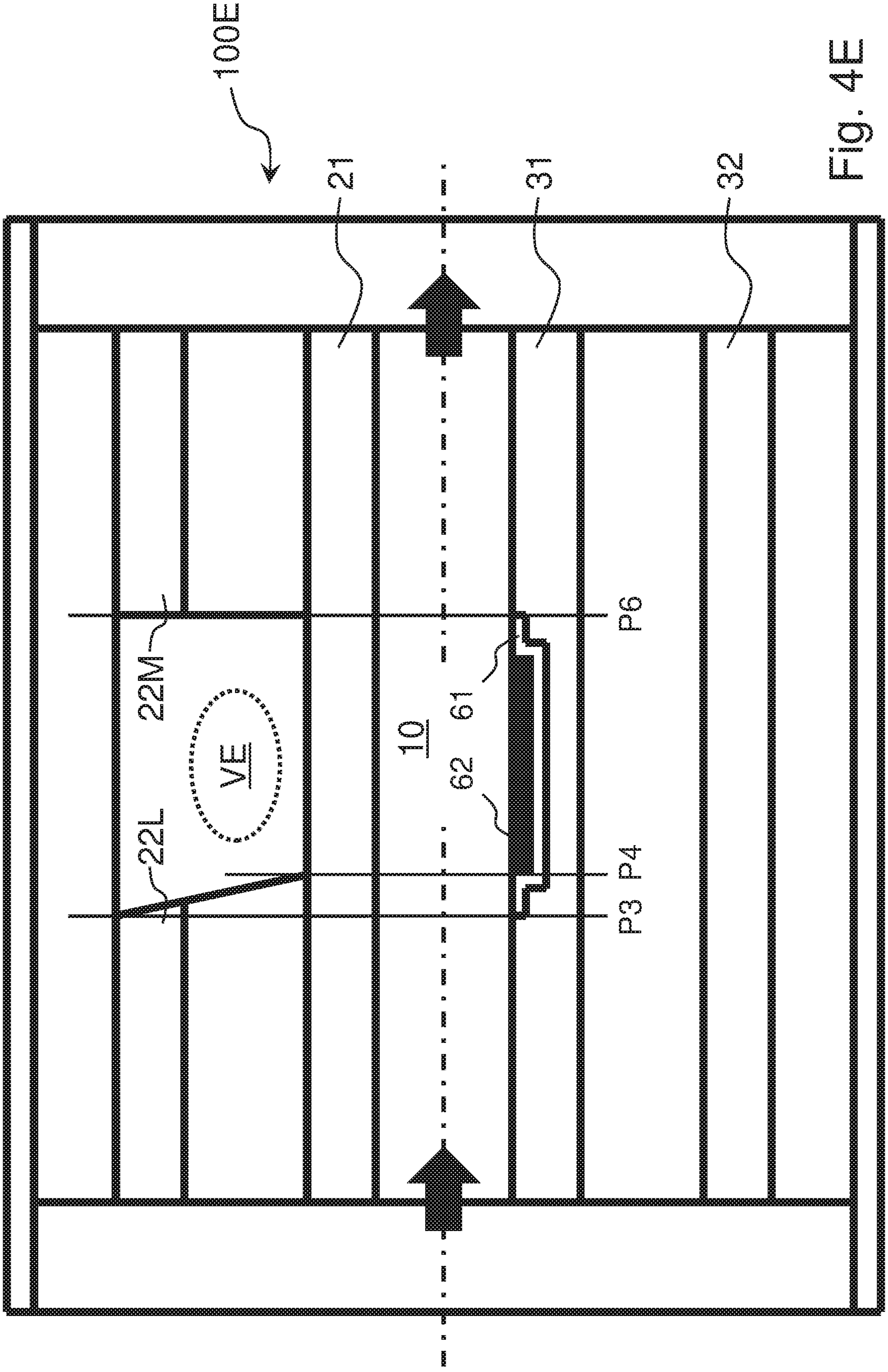
Figure 4F:
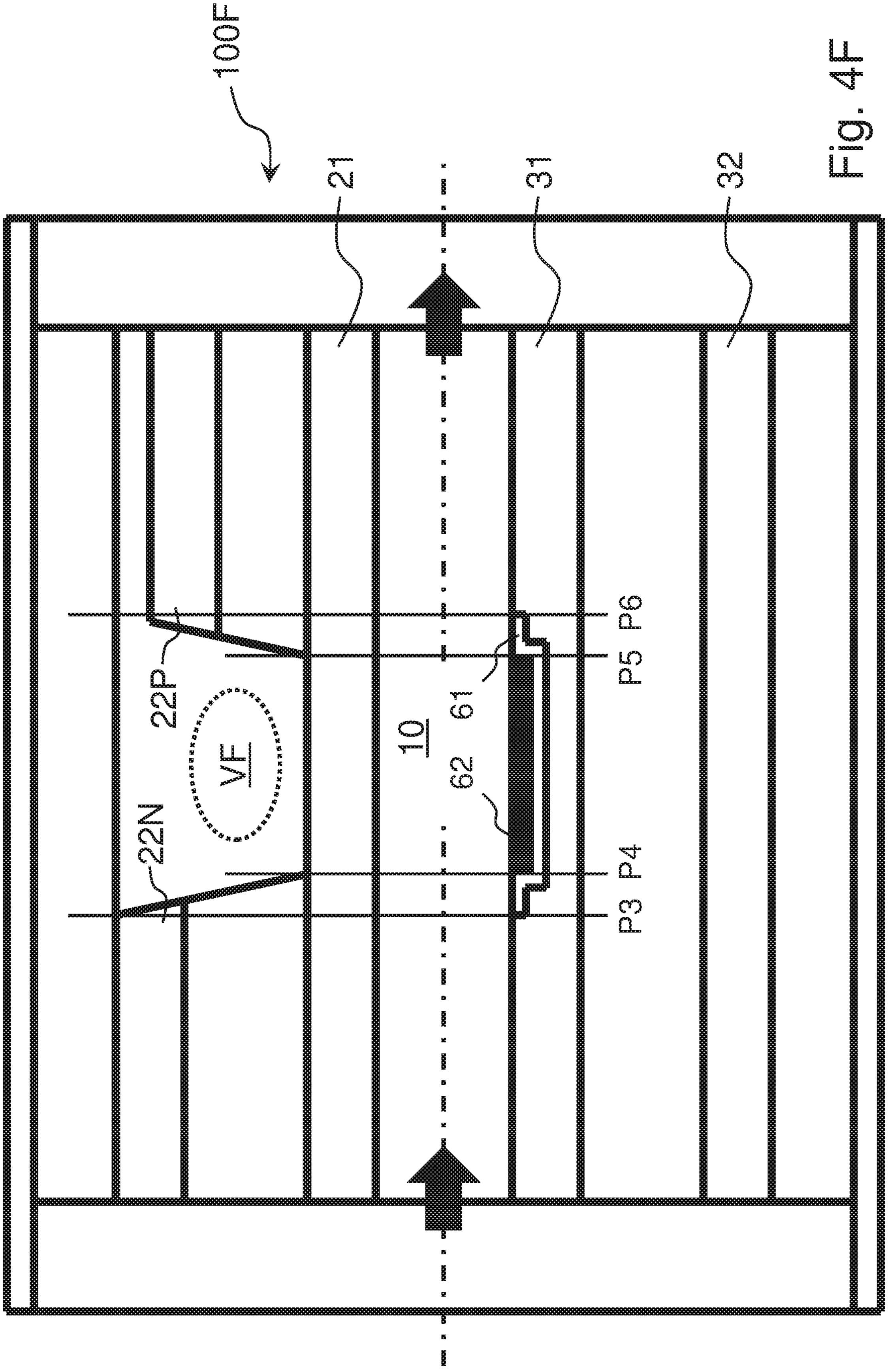
Figure 5A:
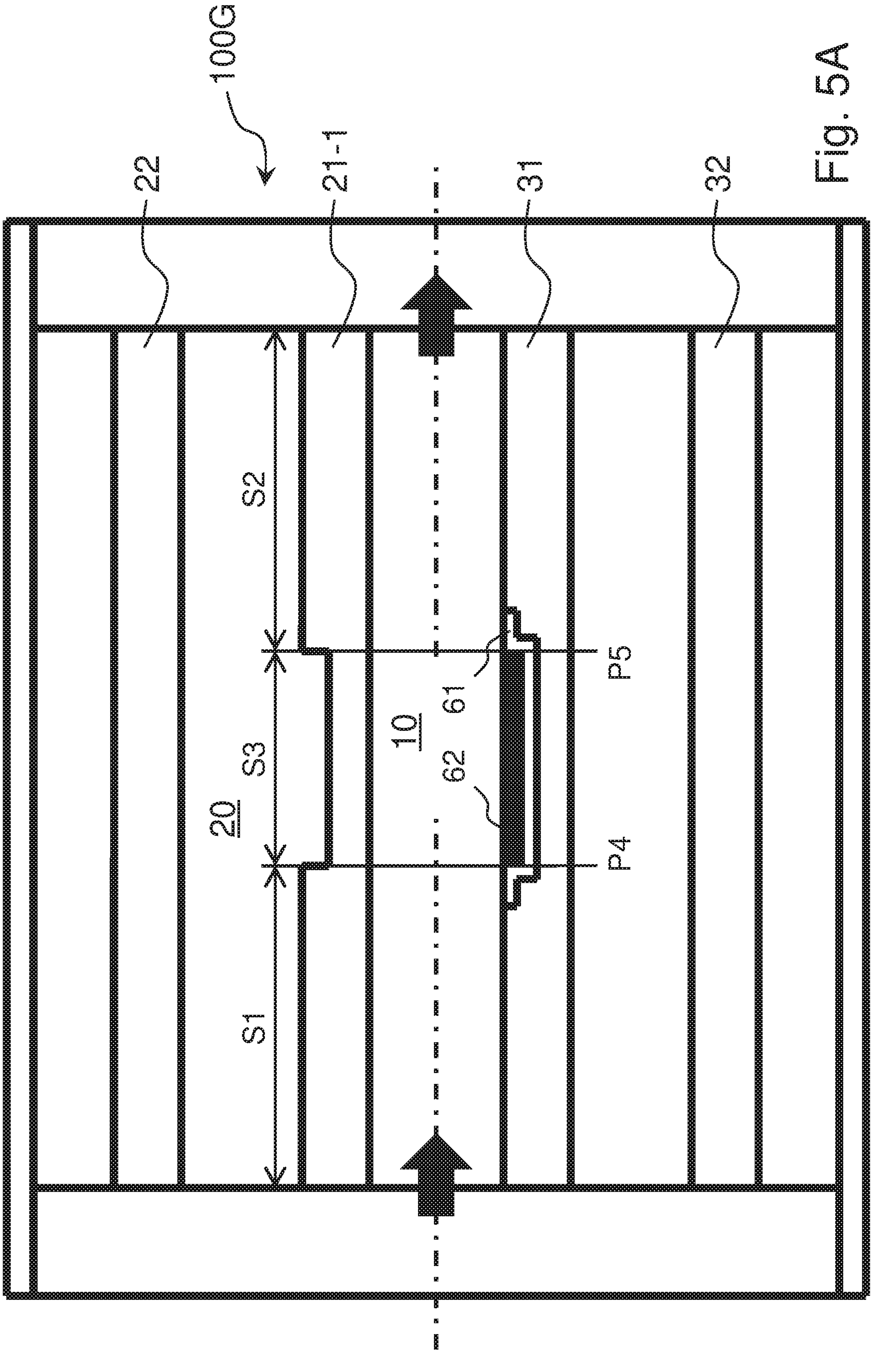
Figure 5B:
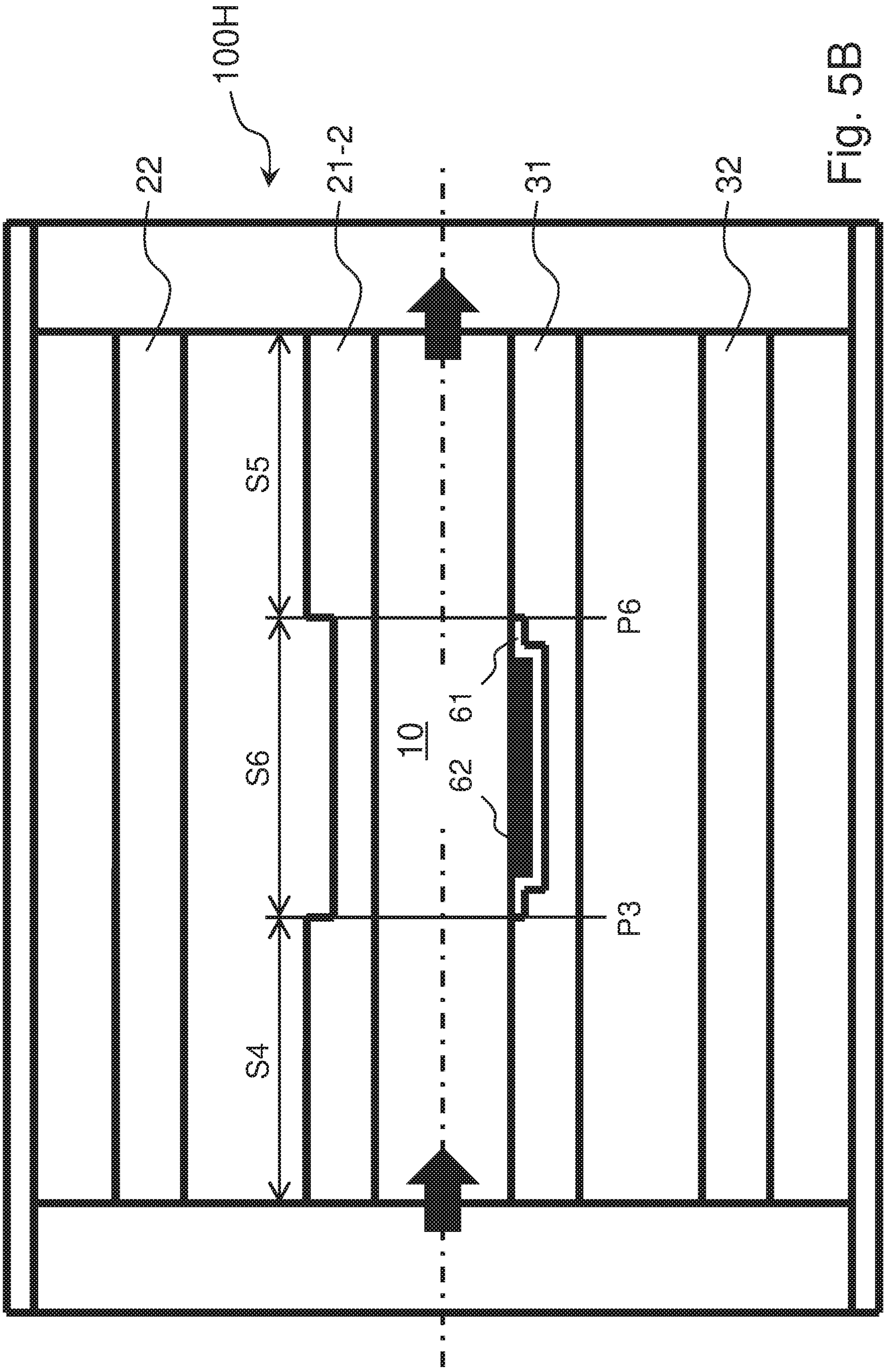
Figure 5C:
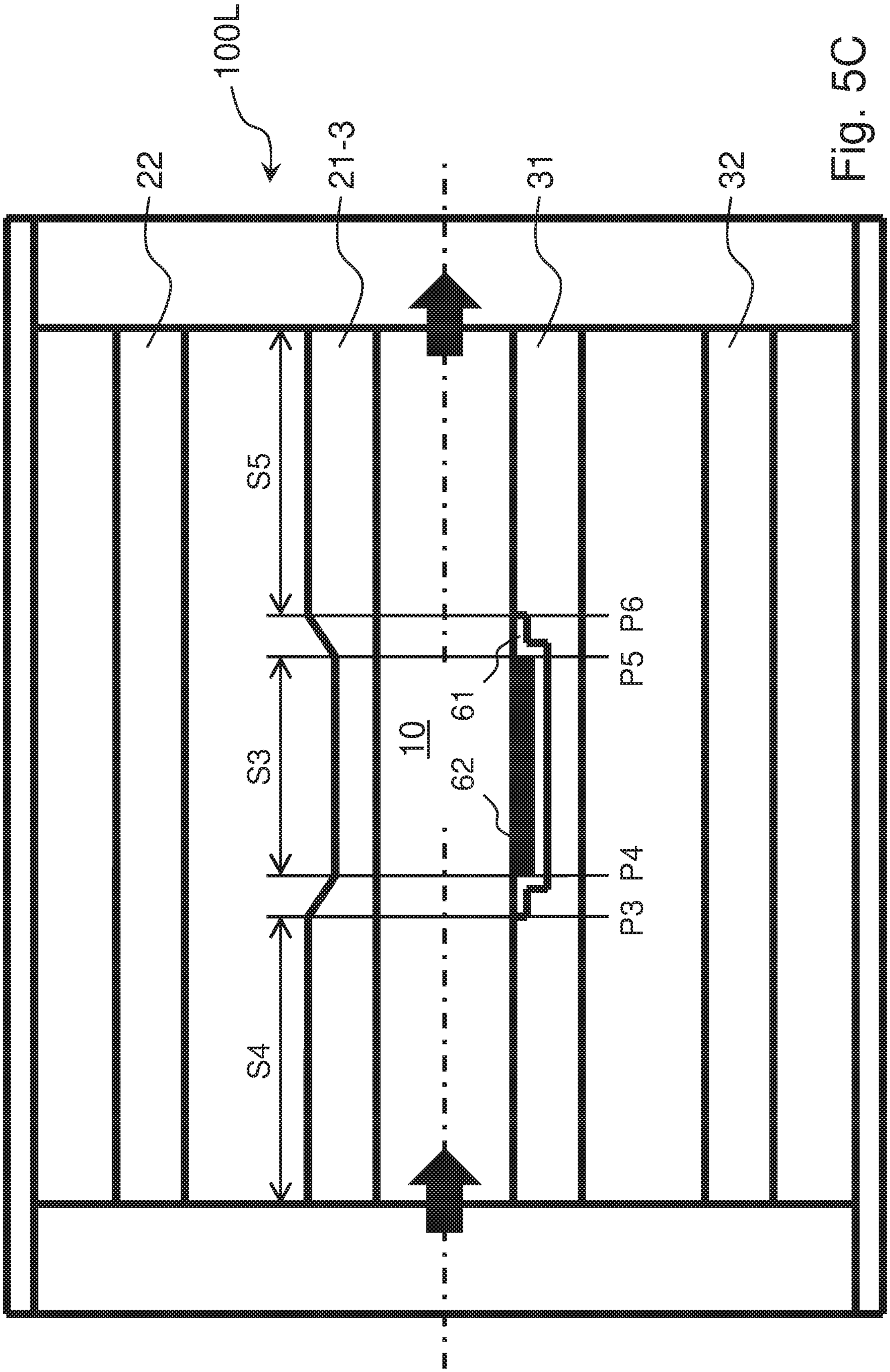
Figures 1, 6:
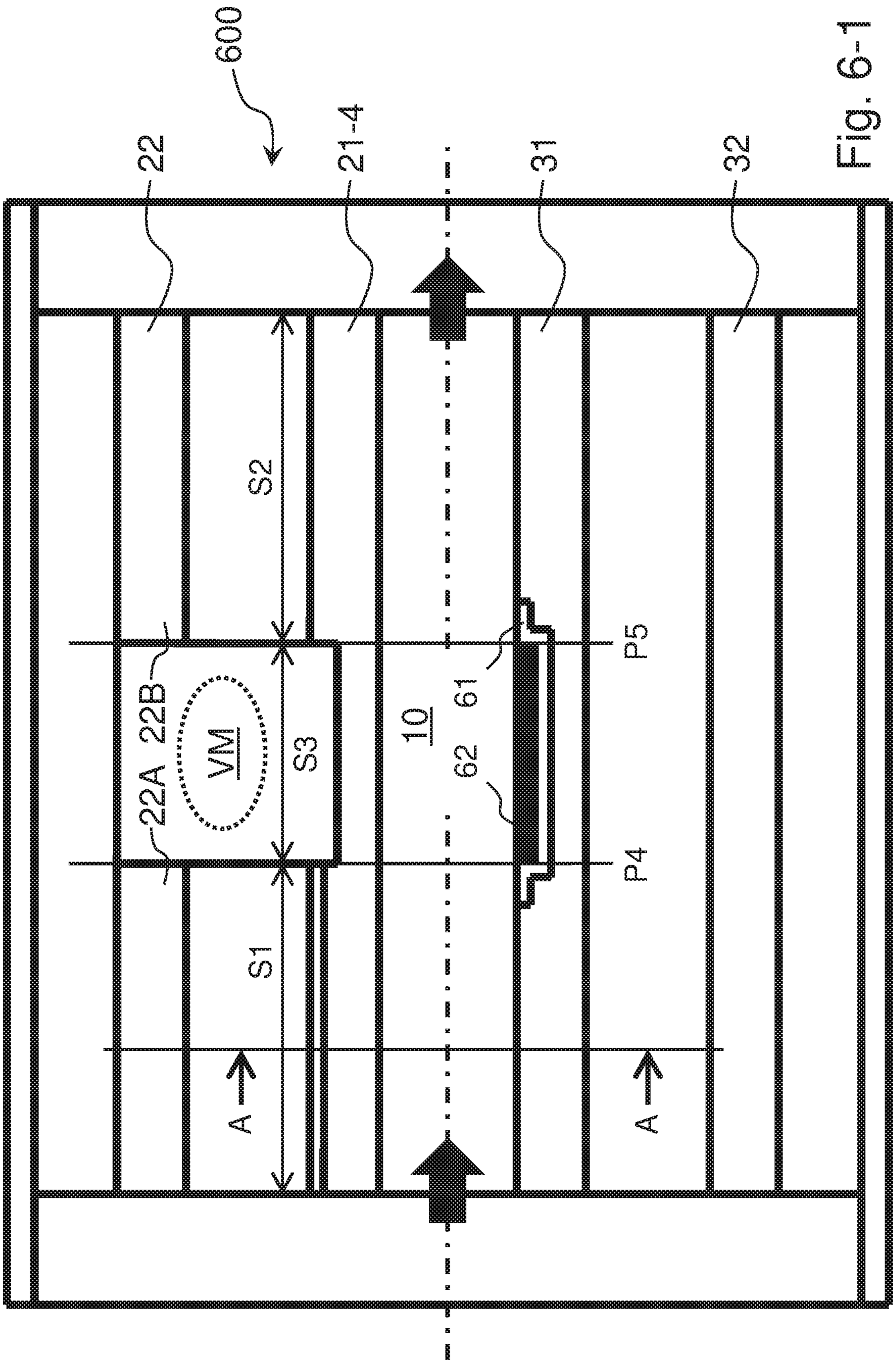
Figures 2, 6:
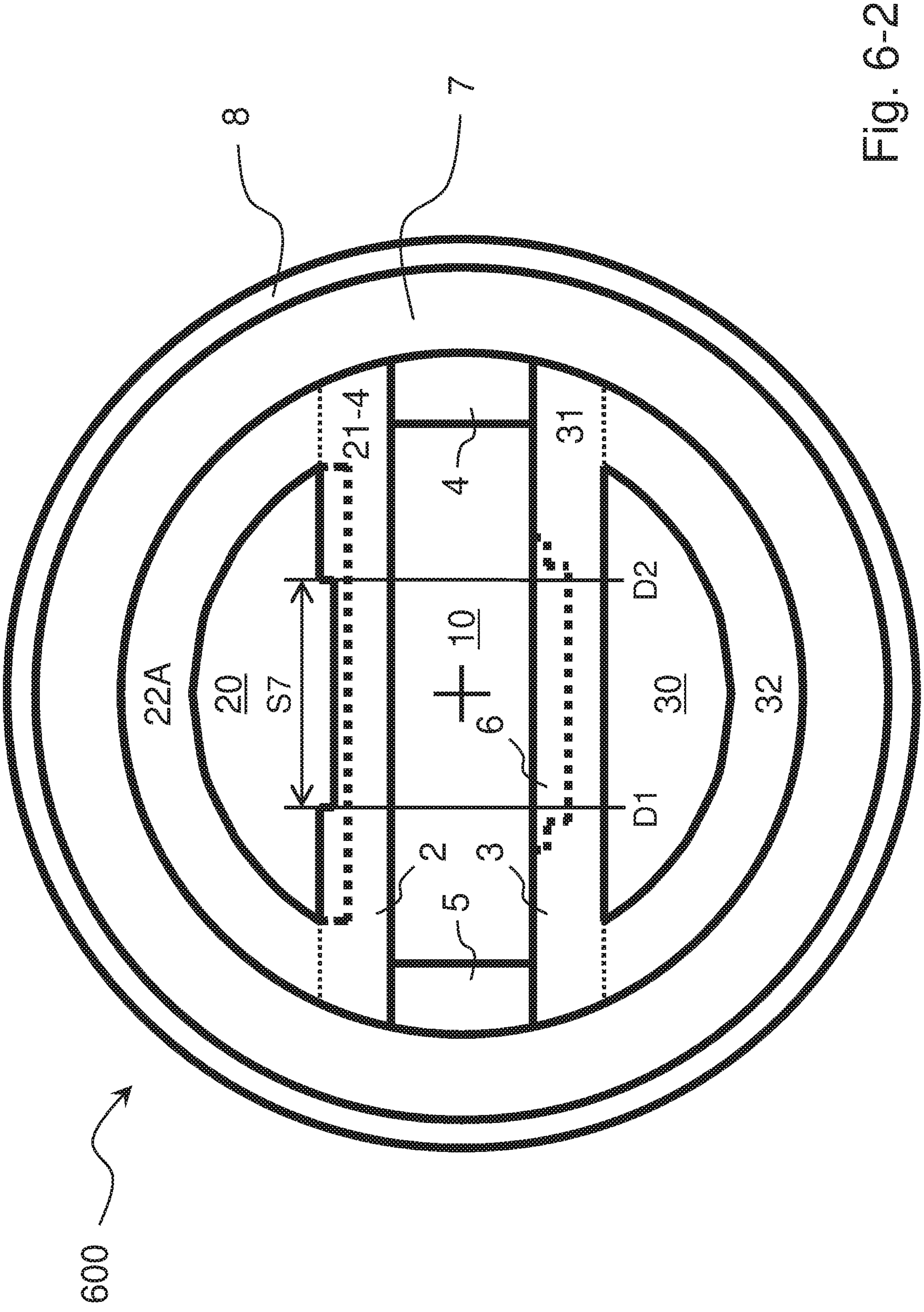
Figure 8:
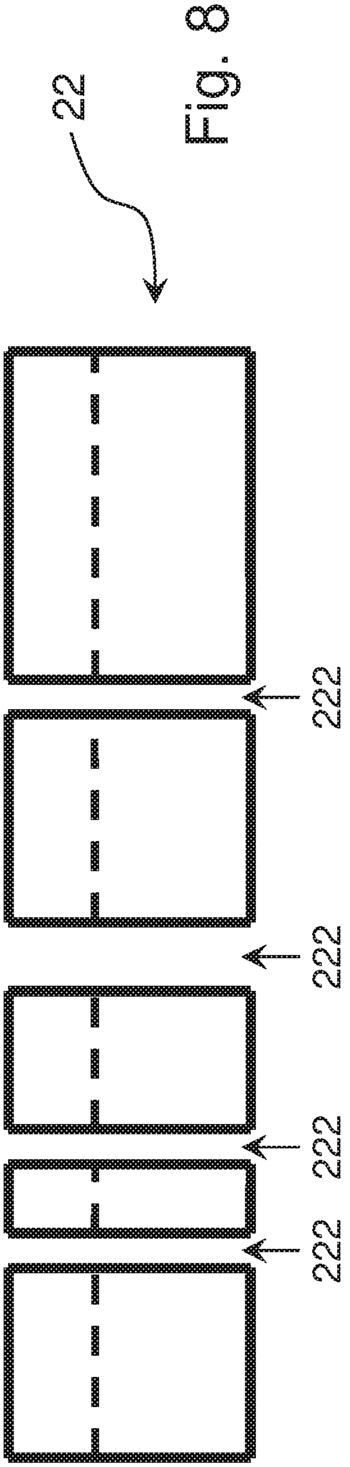
Figure 7:
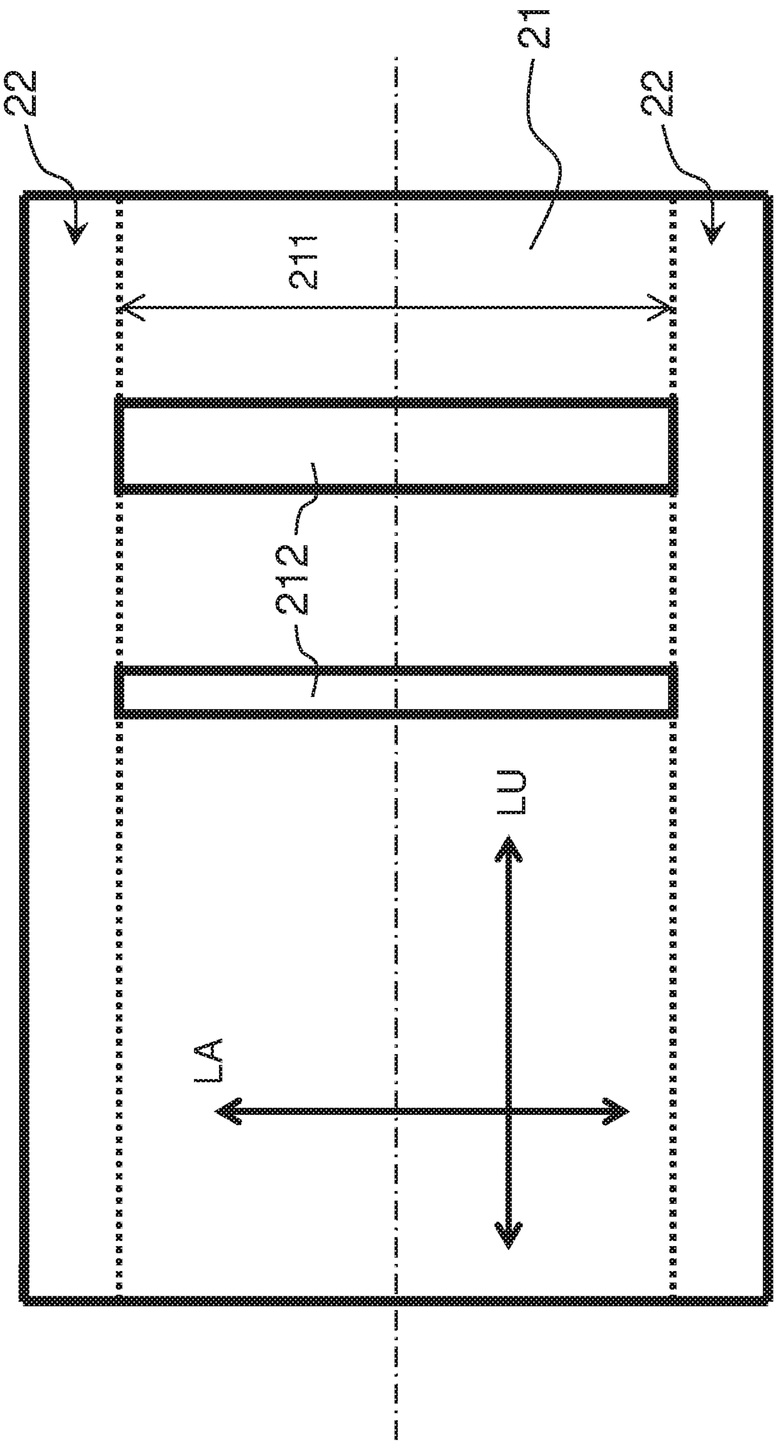

The present invention shall become more readily apparent from the detailed description that follows to be considered together with the accompanying drawings in which:

FIG. 1 shows a cross sectional (schematic) view of a reaction chamber according to the prior art, FIG. 2 shows a longitudinal sectional (schematic) view of the reaction chamber of FIG. 1, FIG. 3 shows an internal (schematic) view from above of part of the reaction chamber of FIG. 1, FIG. 4A shows a longitudinal sectional (schematic) view of a first embodiment of a reaction chamber according to the present invention with a modified curved plate, FIG. 4B shows a longitudinal sectional (schematic) view of a second embodiment of a reaction chamber according to the present invention with a modified curved plate, FIG. 4C shows a longitudinal sectional (schematic) view of a third embodiment of a reaction chamber according to the present invention with a modified curved plate, FIG. 4D shows a longitudinal sectional (schematic) view of a fourth embodiment of a reaction chamber according to the present invention with a modified curved plate, FIG. 4E shows a longitudinal sectional (schematic) view of a fifth embodiment of a reaction chamber according to the present invention with a modified curved plate, FIG. 4F shows a longitudinal sectional (schematic) view of a sixth embodiment of a reaction chamber according to the present invention with a modified curved plate, FIG. 5A shows a longitudinal sectional (schematic) view of a first embodiment of a reaction chamber according to the present invention with a modified flat plate, FIG. 5B shows a longitudinal sectional (schematic) view of a second embodiment of a reaction chamber according to the present invention with a modified flat slab, FIG. 5C shows a longitudinal sectional (schematic) view of a third embodiment of a reaction chamber according to the present invention with a modified flat slab, FIG. 6-1 shows a longitudinal sectional (schematic) view of a fourth embodiment of a reaction chamber according to the present invention with a modified flat plate, FIG. 6-2 shows a cross sectional (schematic) view A-A of the reaction chamber of FIG. 6-1, FIG. 7 shows a view from above of a flat plate for comprising some variants of the present invention, and FIG. 8 shows a side view of a curved plate for comprising some variants of the present invention.

As can be easily understood, there are various ways of practically implementing the present invention which is defined in its main advantageous aspects in the appended claims and is not limited either to the following detailed description or to the appended claims.

DETAILED DESCRIPTION

With reference to FIG. 1 and FIG. 2 and FIG. 3, if the inductor 9 is supplied with an alternating current, alternating electrical currents are induced in the susceptor elements 2, 3, 4 and 5, especially in the elements 2 and 3 (it is to be noted, according to the present invention, that elements 4 and 5 could also be made in full or in part, of electrically insulating material and therefore provide a low contribution to the heating of the reaction and deposition zone 10).

The most typical material for making the susceptor elements is, as known, graphite; this can be used bare or covered, for example, covered in silicon carbide or tantalum carbide.

In element 2, for example, the induced currents follow closed paths around the hole 20; given the symmetry of the element 2, it can be assumed that each of these paths is within a plane perpendicular to the axis (see the "+" sign in FIG. 1) of the chamber 1; one of these planes is for example the plane of FIG. 1. The currents induced in the susceptor elements create heat by the Joule effect.

The Applicant decided to obtain heat generation of the susceptor assembly according to the longitudinal position by varying, in particular, the cross section of the susceptor element 2 as a function of the longitudinal position. Also according to the present invention, the susceptor element with a variable cross section is similar to a projection solid, in particular a perforated projection solid.

The main objective of such variation of the section was that of limiting or preventing the currents induced around the hole in one or more zones of the susceptor assembly.

Furthermore, advantageously, the Applicant decided to obtain heat generation of the susceptor assembly according to the longitudinal and/or transversal position by varying, in particular, the thickness of the susceptor element 2 as a function of the position.

In studying such section and/or thickness variations, at least two factors were considered. The first factor is the conduction of heat within the susceptor elements with particular regard to any heat flows in directions having a parallel component to the axis of the chamber (see "+" sign in FIG. 1). The second factor is the conduction of electrical energy within the susceptor elements with particular regard to any flows of electrical current in directions having a parallel component to the axis of the chamber (see "+" sign in FIG. 1).

Furthermore, the two Ohm laws were also kept in consideration:

$$I=V/R$$

$$R=\rho(l/S)$$

wherein "ρ" is the resistivity of the material of the body or part of the body considered, "l" is the length, "S" is the sectional area.

The embodiments of FIGS. 4 and 5 can be considered variants of the solution of FIG. 1 and FIG. 2 and FIG. 3. The examples of FIG. 4 differ from the solution of FIG. 1 and FIG. 2 and FIG. 3 only because of the configuration of the curved plate of the upper susceptor elements, i.e. the susceptor element opposite to the substrate support element; in particular, the flat plate of this susceptor element faces the substrate support element. The examples of FIG. 5 differ from the solution of FIG. 1 and FIG. 2 and FIG. 3 only because of the configuration of the flat plate of the upper susceptor elements, i.e. the susceptor element opposite to the substrate support element; in particular, the flat plate of this susceptor element faces the substrate support element. The example of FIG. 6 differs from the solution of FIG. 1 and FIG. 2 and FIG. 3 only because of the configuration of the upper susceptor element (i.e. the susceptor element opposite to the substrate support element) and is similar to a combination of the example of FIG. 4A of the example of FIG. 5A; in general, the examples of FIG. 4 and the examples of FIG. 5 can be combined with one another.

Before proceeding with the detailed description of the examples, it is appropriate to specify the following. Reference will essentially be made below to the geometric aspects of the solutions and will be totally independent from the construction aspects. For example, if a "plate" is mentioned, it may comprise one or more parts joined together; in particular, a plate may be obtained by joining two (or more) flat bodies having the same outline, and such two (or more bodies) can be simply overlapped or fixed to one another. It is to be noted that the construction aspects can affect the behaviour of a solution; for example, if a component is obtained by joining two graphite bodies covered in silicon carbide, heat passes easily from one body to the other whereas electrical current does not pass easily from one body to the other.

Another specification relates to the longitudinal positions P1, P2, P3, P4, P5, P6, P7 and P8 previously mentioned. The longitudinal position P4 corresponds to the position of an end of the edge of the substrate 62; the longitudinal position P3 corresponds to the position of an end of the edge of the support element 61; the longitudinal positions P1 and P2 (distanced from one another) correspond to examples of intermediate positions between the end of the edge of the support element 61 and an end of the zone 10; the longitudinal position P5 corresponds to the position of another end of the edge of the substrate 62; the longitudinal position P6 corresponds to the position of another end of the edge of the support element 61; the longitudinal positions P7 and P8 (distanced from one another) correspond to examples of intermediate positions between the other end of the edge of the support element 61 and another end of the zone 10.

In the example 100A of FIG. 4A (that can be considered a variant of the solution of FIG. 1 and FIG. 2 and FIG. 3), the susceptor element 2 comprises:

- a first end zone (that goes from a first end adjacent to the cap 73 at position P4) that comprises a first flat plate 21A and a first curved plate 22A that is joined to the first flat plate 21A,
- a second end zone (that goes from position P5 to a second end adjacent to the cap 72) that comprises a second flat plate 21B and a second curved plate 22B that is joined to the second flat plate 21B, and
- an intermediate zone (that goes from position P4 to position P5) which consists of a third flat plate 21C;

the three flat plates 21A, 21B and 21C are typically made of a single part 21; between the first curved plate 22A and the second curved plate 22B there is a volume VA that fluidly connects a first stretch of hole 20A and a second stretch of hole 20B.

The example 100B of FIG. 4B is similar to the example 100A of FIG. 4A. However, a first curved plate 22C extends to position P3, a second curved plate 22D extends from position P6, and between the two plates there is a volume VB.

The example 100C of FIG. 4C is similar to the example 100A of FIG. 4A. However, a first curved plate 22E extends to position P2, a second curved plate 22F extends from position P7, and between the two plates there is a volume VC.

The example 100D of FIG. 4D is similar to the example 100A of FIG. 4A. However, a first curved plate 22G extends upwards to position P3 and downwards to position P4 (in particular, it is delimited longitudinally by an inclined plane), a second curved plate 22H extends upwards from position P6 and downwards from position P5 (in particular it is delimited longitudinally by an inclined plane), and between the two plates there is a volume VD.

The example 100E of FIG. 4E is similar to the example 100A of FIG. 4A. However, a first curved plate 22L extends upwards to position P3 and downwards to position P4 (in particular, it is delimited longitudinally by an inclined plane), a second curved plate 22M extends from position P6 and between the two plates there is a volume VE.

The example 100F of FIG. 4F is very similar to the example 100D of FIG. 4D. However, a first curved plate 22N and a second curved plate 22P have different radii of curvature and between the two plates there is a volume VF.

In the example 100G of FIG. 5A ((that can be considered a variant of the solution of FIG. 1 and FIG. 2 and FIG. 3)), the susceptor element 2 comprises:

- a first end zone (that goes from a first end adjacent to the cap 73 at position P4) that comprises a first flat plate S1 with a first thickness (in particular a first average thickness),
- a second end zone (that goes from position P5 to a second end adjacent to the cap 72) that comprises a second flat plate S2 with a second thickness (in particular a second average thickness),
- an intermediate zone (that goes from position P4 to position P5) comprises a third flat plate S3 with a third thickness (in particular a third average thickness);

the three flat plates S1, S2 and S3 are typically made of a single piece 21-1; in this example, the third thickness is less than the first thickness and the second thickness. Furthermore, the susceptor element 2 comprises a single curved plate 22 analogous to the curved plate of the chamber of FIG. 1 and FIG. 2 and FIG. 3 and that surrounds the hole 20.

The example 100H of FIG. 5B is similar to the example 100G of FIG. 5A. However, a first flat plate S4 extends to position P3, a second flat plate S5 extends from position P6, a third flat plate S6 extends between position P3 and position P6 and the three plates are typically made of a single piece 21-2.

The example 100L of FIG. 5C is similar to the example 100G of FIG. 5A. However, a first flat plate S4 extends to position P3, a second flat plate S5 extends from position P6, a third flat plate S3 extends between position P4 and position P, there is a first small connector between plates S4 and S3, there is a second small connector between plates S3 and S5, and the three plates and the two connectors are typically made of a single piece 21-3.

The lowering of the flat plate 21-1, 21-2, 21-3, 21-4 in the examples 100G, 100H and 100L of FIG. 5 and in the example of the flat plate in example 600 of FIG. 6 is used to restrict the induced currents flowing into the intermediate zone of the susceptor element 2.

The example 600 of FIG. 6 (i.e. FIG. 6-1 and FIG. 6-2) is very similar to the example 100A of FIG. 4A in relation to the curved plate 22 and to the example 100G of FIG. 5A in relation to the flat plate 21-4, and has a volume VM in the centre. However, the first plate S1 has a central lowering S7 (i.e. centred with respect to the axis of the chamber—see FIG. 6-2) which extends in the longitudinal direction (see FIG. 6-1). In particular, the lowering S7 is aligned with the assembly 6 (see FIG. 6-2); more in particular, the width of the lowering 7 corresponds to the diameter of the substrate 62. The lowering S7 faces the hole 20. In particular, the thickness of the plate S1 at the lowering S7 is greater than the thickness of the plate S3.

The lowering S7 is used to heat the gases entering the reaction and deposition zone more (transversally) in the centre, in particular between the transverse positions D1 and D2 (symmetrical with respect to the axis of the zone 10) with respect to the sides (consider in FIG. 6-2 the position with respect to elements 4 and 5).

In general, a reaction chamber according to the present invention is used for an epitaxial reactor adapted for the deposition of semiconductor material (in particular silicon carbide) on a substrate (in particular silicon carbide); it extends in a longitudinal direction and comprises a reaction and deposition zone that extends in the longitudinal direction; this zone is defined by susceptor elements adapted to be heated by electromagnetic induction); (at least) a first susceptor element has a hole that extends in the longitudinal direction for the entire length thereof; the first susceptor element has a non-uniform cross section that depends on its longitudinal position.

At least the first susceptor element typically resembles a projection solid, in particular a perforated projection solid.

Typically, the first susceptor element has a first (longitudinal) end zone and a second (longitudinal) end zone and an intermediate (longitudinal) end zone; the first end zone and the second end zone can be equal.

According to a first typical simple and general possibility, the sectional area in the intermediate zone is smaller than the sectional area in the first end zone and in the second end zone.

According to a typical configuration, the first susceptor element comprises (at least) a flat plate (that partially delimits the reaction and deposition zone) and (at least) a curved plate (that does not delimit the reaction and deposition zone) that is joined to the flat plate (similarly to the reaction chamber of FIG. 1 and FIG. 2); the flat plate and the curved plate surround the hole of the first susceptor element. In FIG. 7 a flat plate 21 is shown (which has a plurality of grooves 212) in particular of the upper susceptor element; in FIG. 8 a curved plate 22 is shown (which has a plurality of cuts 222) in particular of the upper susceptor element; the plate 21 of FIG. 7 and the plate 22 of FIG. 8 are joined to form a susceptor element, in particular an upper susceptor element (note the two arrows 22 in FIG. 7) that can also be a single piece; the reference 211 indicates the portion of the plate 21 that is not in contact with the plate 22.

If such a typical configuration is used, a first way of obtaining non-uniform generation of heat of the susceptor assembly envisages that the curved plate has at least one cut (see for example the cuts 222) and/or at least one hole of appropriate dimensions; the hole can be oriented radially i.e. in the perpendicular direction to the longitudinal direction of the first susceptor element; the cut can extend circumferentially (see for example the cuts 222). In FIG. 8, the number, width and position of the cuts 222 influence the generation of heat.

If such a typical configuration is used, a second way of obtaining non-uniform generation of heat of the susceptor assembly envisages the curved plate having a variable thickness.

If such a typical configuration is used, a third way of obtaining non-uniform generation of heat of the susceptor assembly envisages the flat plate having a variable thickness. FIG. 7 represents a case in which such thickness variability derives from grooves obtained on the side of the plate 21 facing towards the hole 20; the grooves 212 are rectilinear and oriented towards the width LA of the reaction chamber but, alternatively, they could be oriented for example according to the length LU of the reaction chamber. In general, the number, the shape, the width, the length, the position and the orientation of the grooves (obtained on the side of the flat plate turned towards the hole) influence the generation of heat.

These three ways (and others) can be variously combined with one another.

According to some first embodiments, the first susceptor element has a first (longitudinal) end zone and a second (longitudinal) end zone and an intermediate (longitudinal) zone, wherein the first end zone comprises a first flat plate and a first curved plate which is joined to the first flat plate, wherein the second end zone comprises a second flat plate and a second curved plate which is joined to the second flat plate, and wherein the intermediate zone consists of a third flat plate.

These first embodiments can envisage a means adapted to conduct heat in the radial direction situated between the first curved plate and the second curved plate.

According to some second embodiments, the first susceptor element has a first (longitudinal) end zone and a second (longitudinal) end zone and an intermediate (longitudinal) zone, wherein the first end zone comprises a first flat plate with a first (average) thickness, wherein the second end zone comprises a second flat plate with a second (average) thickness, and wherein the intermediate zone comprises a third flat plate with a third (average) thickness;

the third thickness can be less than or greater than the first thickness or the second thickness.

These second embodiments can envisage the first flat plate and/or the second flat plate having a (thin) central lowering or raising that extends in the longitudinal direction (see for example FIG. 6).

It is to be noted that third embodiments can combine characteristics of the first embodiments and characteristics of the second embodiments.

Typically, the chamber according to the present invention comprises a disk-shaped support element (preferably rotatable) (consider for example reference 61) adapted to support (directly or indirectly) one or more substrates (consider for example reference 62) in the reaction and deposition zone; the first susceptor element can preferably be situated frontally with respect to this support element; in particular, the flat wall of the intermediate zone of the first susceptor element is situated frontally with respect to this support element. All this is valid for the examples of the figures. In these cases, the support element can be placed at a certain distance from the third flat wall.

The diameter of the support element 61 or of the substrate 62 can be equal to the product of the length of the reaction and deposition zone and is a factor of k1; wherein k1 is, for example, comprised between 0.3 and 0.9 or between 0.5 and 0.8.

The diameter of the support element 61 or of the substrate 62 can be equal to the product of the width of the reaction and deposition zone and is a factor of k2; wherein k2 is, for example, comprised between 0.3 and 0.9 or between 0.5 and 0.8.

The diameter of the support element 61 or of the substrate 62 can be equal to the product of the height of the reaction and deposition zone and is a factor of k3; wherein k3 is, for example, comprised between 0.1 and 0.3. The characteristic related to the height of the reaction and deposition zone can also be defined in absolute terms; in this case, the height is comprised, for example, between 10 and 100 mm or between 20 and 40 mm.

It is to be noted that k1 and k2 and k3 are generally different in particular because the reaction and deposition zone is typically longer than it is wide. Typically, the chamber according to the present invention comprises an inductor assembly adapted to create an electromagnetic field for heating the electromagnetic induction susceptor elements; the inductor assembly can preferably be arranged to heat differently a first (longitudinal) end zone and a second (longitudinal) end zone and a (longitudinal) intermediate zone of the first susceptor element. In these cases, the inductor assembly can comprise a first inductor at the first (longitudinal) end zone and a second inductor at the second (longitudinal) end zone. Furthermore, there may be a shielding unit adapted to limit the electromagnetic coupling between the first inductor and the second inductor.

The invention claimed is:

1. A reaction chamber for an epitaxial reactor adapted to deposition of semiconductor material on a substrate comprising:

- a reactor wall which extends in a longitudinal direction;
- a reaction and deposition zone extending in said longitudinal direction, wherein said reaction and deposition zone is defined by susceptor elements configured to be heated by electromagnetic induction,
- wherein a first susceptor element of said susceptor elements is opposite to a substrate support element and has a hole extending in said longitudinal direction along its whole length,
- wherein said first susceptor element has a non-uniform transverse cross-section which depends on its longitudinal position;
- further comprising a volume defined at least partially by the first susceptor element and at least partially by the reactor wall;
- wherein said first susceptor element comprises a flat plate and a curved plate which is joined to said flat plate, wherein said flat plate and said curved plate surround said hole; and
- wherein said curved plate has at least one cut or at least one hole, and wherein said cut or hole at least partially defines the volume.

2. The chamber according to claim 1, wherein said first susceptor element has a first end zone and a second end zone and an intermediate zone, wherein the sectional area at said intermediate zone is smaller than the sectional area at said first end zone and at said second end zone.

3. The chamber according to claim 2, wherein said first end zone and said second end zone are equal.

4. The chamber according to claim 1, wherein said curved plate has a variable thickness.

5. The chamber according to claim 1, wherein said flat plate has a variable thickness.

6. The chamber according to claim 1, wherein said first susceptor element has a first end zone and a second end zone and an intermediate zone,

- wherein within said first end zone, the flat plate has a first thickness,
- wherein within the said second end zone the flat plate has a second thickness,
- wherein within said intermediate zone the flat plate has a third thickness; and
- wherein said third thickness is lower or higher than said first thickness and said second thickness.

7. The chamber according to claim 6, wherein said flat plate within the first end zone or the second end zone has a central lowering or central raising which develops in said longitudinal direction.

8. The chamber according to claim 1, wherein the substrate support element comprises a disk-shaped support element adapted to support one or more substrates in said reaction and deposition zone, wherein said opposite to said support element.

9. The chamber according to claim 1, comprising an inductor assembly adapted to create an electromagnetic field for heating said electromagnetic induction susceptor elements, wherein said inductor assembly is arranged to differentially heat a first end zone and a second end zone and an intermediate zone of said first susceptor element.

10. A reactor comprising the reaction chamber according to claim 1.

11. A reaction chamber for an epitaxial reactor adapted to deposition of semiconductor material on a substrate comprising:

- a reactor wall which extends in a longitudinal direction;
- a reaction and deposition zone extending in said longitudinal direction, wherein said reaction and deposition zone is defined by susceptor elements configured to be heated by electromagnetic induction,
- wherein a first susceptor element of said susceptor elements is opposite to a substrate support element and has a hole extending in said longitudinal direction along its whole length,
- wherein said first susceptor element has a non-uniform transverse cross-section which depends on its longitudinal position; and
- wherein the first susceptor element is defined by
  - a first end zone comprising a first flat plate and a first curved plate joined to the first flat plate and forming a first portion of the hole therebetween;
  - a second end zone comprising a second flat plate and a second curved plate joined to the second flat plate and forming a second portion of the hole therebetween; and
  - an intermediate zone comprising a third flat plate and a volume between the first curved plate and the second curved plate;
- wherein the volume fluidly connects the first portion of the hole and the second portion of the hole, and wherein the volume is at least partially defined by the reactor wall.

* * * * *